United States Patent
Partsch et al.

(10) Patent No.: US 6,777,990 B2
(45) Date of Patent: Aug. 17, 2004

(54) DELAY LOCK LOOP HAVING AN EDGE DETECTOR AND FIXED DELAY

(75) Inventors: Torsten Partsch, Chapel Hill, NC (US); George W. Alexander, Durham, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/100,639

(22) Filed: Mar. 19, 2002

(65) Prior Publication Data

US 2003/0179025 A1 Sep. 25, 2003

(51) Int. Cl.[7] ................................................. H03L 7/06
(52) U.S. Cl. ....................................... 327/149; 327/158
(58) Field of Search ................................. 327/149, 153, 327/156, 158, 161, 263, 276; 331/25, DIG. 2; 375/375, 376, 215

(56) References Cited

U.S. PATENT DOCUMENTS 5,463,337 A * 10/1995 Leonowich ................. 327/158
5,926,053 A * 7/1999 McDermott et al. ........ 327/298
6,362,995 B1 * 3/2002 Moon et al. .................. 365/51
6,452,432 B2 * 9/2002 Kim ............................ 327/158

* cited by examiner

Primary Examiner—Timothy P. Callahan
Assistant Examiner—Linh M. Nguyen
(74) Attorney, Agent, or Firm—Thomas R. FitzGerald, Esq.

(57) ABSTRACT

A delay lock loop circuit includes a forward delay circuit receiving a reference clock signal and issuing a first delayed clock signal. The forward delay circuit adjustably shifts in time the first delayed clock signal relative to the reference clock signal. A fixed delay circuit receives the first delayed clock signal and issues a second delayed clock signal. A feedback delay circuit receives a selected one of the first delayed and the second delayed clock signals, and issues a feedback clock signal. The feedback clock signal is shifted in time relative to the selected one of the first delayed and the second delayed clock signals.

12 Claims, 2 Drawing Sheets

DELAY LOCK LOOP HAVING AN EDGE DETECTOR AND FIXED DELAY

FIELD OF THE INVENTION

The present invention relates generally to integrated circuits, and, more particularly, to a delay lock loop circuit.

BACKGROUND OF THE INVENTION

Clock signals are used in virtually every integrated circuit (IC) to control the operational timing of the IC and/or the transfer of data within and between ICs. For example, all individual circuits or devices, such as, for example, flip-flops and/or latches, in a given IC may change state on a single rising or falling edge of a common clock signal. Relatively large ICs, such as, for example, memory chips, programmable logic arrays, or any other IC that requires clock skew adjustment, include thousands or even millions of such individual circuits or devices. The clock signal is typically applied to a clock input pin of the IC for distribution to each of those numerous devices throughout the IC. Thus, the clock signal is transmitted or propagated from the clock input pin to devices on the IC that are both relatively near to and relatively distant from the clock input pin. By the time the clock signal reaches the devices that are disposed on portions of the IC that are relatively remote from the input pin, the clock signal is likely to have suffered significant propagation delay.

The clock signal received at the IC clock input is hereinafter referred to as the input or reference clock signal REF_CLK, whereas the clock signal received by the last-served device on the IC is hereinafter referred to as the propagated clock signal P_CLK. The propagation delay between the REF_CLK and P_CLK signals, designated hereinafter as $t_P$, may cause difficulties in interfacing between ICs and/or slow down the overall operating speed of a system. For example, data may be provided or input to an IC in a time-aligned manner with the reference clock signal, whereas data output from the IC is likely to be provided in a time-aligned manner with the propagated clock signal.

The propagation delay $t_P$ for a particular IC is dependent at least in part upon the configuration of that particular IC. Thus, for a given IC $t_P$ is generally fixed. However, $t_P$ will vary due to external factors, such as, for example, changes in ambient temperature, package temperature, and/or applied voltage. It is beneficial to compensate for the effect of such external factors on the propagation delay $t_P$ of the reference clock signal by aligning in time the propagated clock signal P_CLK of an IC with the reference clock signal REF_CLK. Delay lock loop circuits are one way in which such time alignment is performed.

Delay lock loop (DLL) circuits receive the reference clock signal REF_CLK and produce an output clock signal CLK_OUT that is advanced or delayed relative to the reference clock signal REF_CLK. For convenience, all signals produced by a DLL will hereinafter be referred to as being delayed relative to the REF_CLK signal regardless of whether the particular signal is actually advanced or delayed relative to the reference clock signal. A DLL delays the output clock signal CLK_OUT by an amount of time that is approximately equal to the propagation delay $t_P$ of the IC, i.e., the amount of time required for the reference clock signal REF_CLK to propagate through the IC under predefined operating conditions. Further, a DLL adjusts the CLK_OUT signal to compensate for changes in $t_P$ due to the aforementioned external factors. Devices formed on portions of the IC that are proximate the clock input pin are typically supplied with the REF_CLK signal, whereas devices formed on portions of the IC relatively distant from the input clock signal are typically supplied with the CLK_OUT signal. Thus, all devices on the IC receive time-aligned clock signals.

The DLL adjusts the amount of time by which the CLK_OUT signal is delayed relative to the REF_CLK signal by comparing the REF_CLK signal to a feedback clock signal FB_CLK. The FB_CLK signal is essentially a delayed version of the CLK_OUT signal. The FB_CLK signal is delayed by a feedback delay circuit that models the propagation delay through the integrated circuit. Thus, the time delay of the FB_CLK signal relative to the CLK_OUT signal is, for example, proportional or equal to the propagation delay $t_P$ of the IC. As the aforementioned external factors affect the propagation delay through the IC, the time delay introduced by the feedback delay circuit changes correspondingly.

The CLK_OUT signal is essentially a delayed version of the REF_CLK signal. The delay of the CLK_OUT signal is adjusted by a forward delay circuit having a forward delay line, such as, for example, a predetermined number of buffers or invertors connected together in series. The length of the forward delay line is adjusted based upon a comparison of the REF_CLK signal to the feedback clock signal FB_CLK, to thereby adjust the delay of the CLK_OUT signal and to align the CLK_OUT signal with the REF_CLK signal at the end of the clock tree. Thus, changes in the propagation delay due to the external factors are compensated for and the clock signals are aligned for a range of operating conditions and parameters.

In designing DLLs, a tradeoff between conflicting design goals has heretofore been required. The first design goal of a conventional DLL is to provide a maximum delay time approximately equal to the longest anticipated cycle time (i.e., the lowest operating frequency) of the REF_CLK signal to ensure alignment under worst-case operating conditions. The second design goal is to provide high resolution, i.e., small time increments, in the adjustment of the delay of the CLK_OUT signal, to maximize the alignment of the clocks and, therefore, the operating speed of the IC. Satisfying both of those goals requires a DLL having a delay line with a multitude of delay stages to thereby provide both high resolution and a wide frequency adjustment range.

However, as the resolution of the forward delay line increases the DLL must sequence through the delay line in correspondingly small time increments. Thus, compared to a DLL of lower resolution, a DLL having a high-resolution delay line requires a longer period of time to sequence through its correspondingly small time increments in order to reach a locked state. Further, such high-resolution delay lines consume relatively large amounts of valuable space on the substrate of the integrated circuit. Moreover, the entire length of the delay line is only utilized under worst case operating conditions.

Therefore, what is needed in the art is a DLL that achieves both the delay time required for worst-case operating conditions and a relatively high resolution, and yet has relatively few delay stages.

Furthermore, what is needed in the art is a DLL that achieves a locked state in a relatively short time period even under operating conditions approaching or equal to worst-case operating conditions.

SUMMARY OF THE INVENTION

The present invention provides a delay lock loop circuit for aligning in time a reference clock signal with an internal feedback clock signal that tracks changes in the propagation delay of an integrated circuit.

The invention comprises, in one form thereof, a forward delay circuit receiving a reference clock signal and issuing a first delayed clock signal. The forward delay circuit adjustably shifts in time the first delayed clock signal relative to the reference clock signal. A fixed delay circuit receives the first delayed clock signal and issues a second delayed clock signal. A feedback delay circuit receives a selected one of the first delayed and the second delayed clock signals, and issues a feedback clock signal. The feedback clock signal is shifted in time relative to the selected one of the first delayed and the second delayed clock signals.

An advantage of the present invention is that a relatively high resolution is achieved with relatively few delay stages.

Another advantage of the present invention is that time alignment is achieved in a relatively short amount of time even under operating conditions equal to and approaching worst-case.

BRIEF DESCRIPTION OF THE DRAWINGS

The above-mentioned and other features and advantages of this invention, and the manner of attaining them, will become appreciated and be more readily understood by reference to the following detailed description of one embodiment of the invention in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE DRAWINGS

Figure 1:
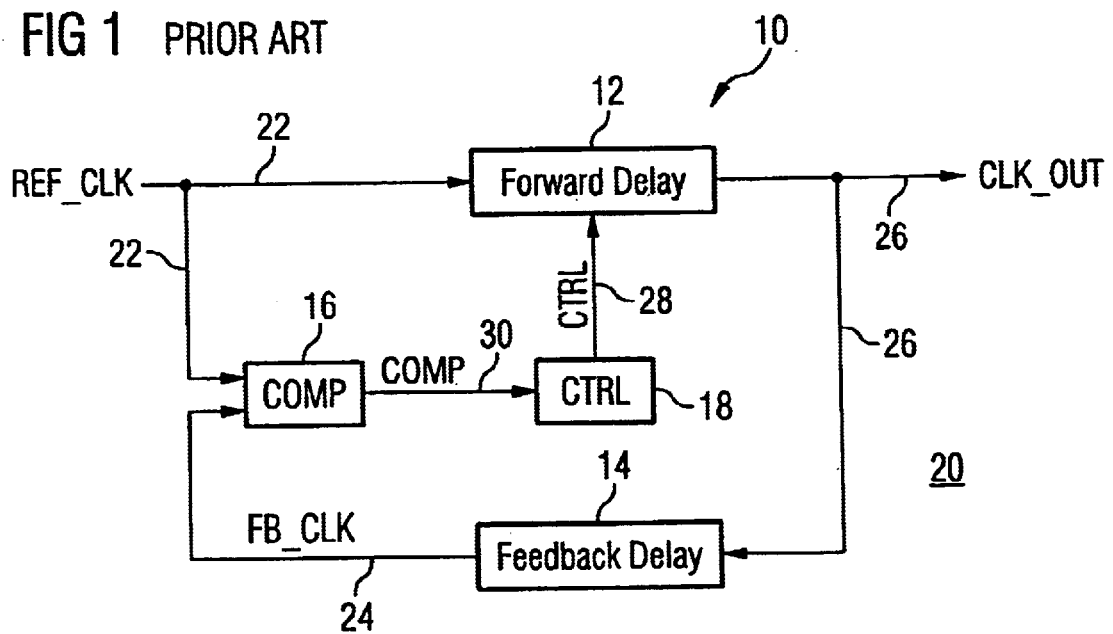
FIG. 1 is a block diagram of a conventional DLL.

Referring now to FIG. 1, a block diagram of a conventional DLL circuit is shown. DLL circuit 10 includes forward delay circuit 12, feedback delay circuit 14, compare circuit COMP 16 and control circuit CTRL 18. Typically, DLL circuit 10 is formed on a common substrate with, or is commonly packaged with and interconnected to, integrated circuit (IC) 20, such as, for example, a dynamic random access memory (DRAM) chip. Generally, DLL circuit 10 receives reference clock signal REF_CLK 22, compares REF_CLK 22 to a feedback clock signal FB_CLK 24, and issues output clock signal CLK_OUT 26 based at least in part upon the comparison. The comparison is iterated until REF_CLK signal 22 is aligned with FB_CLK signal 24, thus ensuring that CLK_OUT signal 26 has the correct phase at the end of the clock tree.

Forward delay circuit 12 is electrically connected to CTRL circuit 18 and receives therefrom CTRL signal 28. Forward delay circuit 12 receives REF_CLK signal 22 and issues CLK_OUT signal 26, which is generally a delayed version of REF_CLK signal 22. The amount of time by which forward delay circuit 12 delays CLK_OUT signal 26 relative to REF_CLK signal 22 is dependent at least in part upon CTRL signal 28. Forward delay circuit 12 includes a plurality of delay elements (not shown), such as, for example, buffers or invertors, connected in series. Each of the delay elements has a delay time of one unit delay, or $t_U$. A unit delay can be any period of time appropriate to the application of DLL 10, such as, for example, tens, hundreds or thousands of picoseconds, or longer.

Feedback delay circuit 14 is electrically connected to forward delay circuit 12 and receives therefrom CLK_OUT 26. Feedback delay circuit 14 is further electrically connected to compare circuit COMP 16, and issues thereto FB_CLK signal 24, which is generally a delayed version of CLK_OUT 26. The FB_CLK signal 24 is delayed relative to CLK_OUT 26 by a feedback delay time, $t_{FB}$. The feedback delay time $t_{FB}$ is, for example, substantially equal to the propagation delay $t_P$ of the REF_CLK signal 22 through IC 20. Feedback delay circuit 14 includes one or more delay elements (not shown), such as, for example, buffers or inverters, that delay FB_CLK signal 24 relative to the CLK_OUT signal 26 by feedback time $t_{FB}$. Feedback delay time $t_{FB}$ tracks changes in $t_P$ due to the aforementioned external factors, and thus feedback delay circuit 14 models the propagation delay through IC 20 across a predefined range of operating conditions and parameters.

Compare circuit COMP 16 receives REF_CLK signal 22 and FB_CLK signal 24. Compare circuit 16 compares REF_CLK signal 22 to FB_CLK signal 24, and issues COMP signal 30 to control circuit CTRL 18. Compare circuit COMP 16 is conventional in construction and design, such as, for example, a phase detector, and is known to those skilled in the art. COMP signal 30 is indicative of the phase of REF_CLK signal 22 relative to FB_CLK signal 24, and thus indicates whether REF_CLK signal 22 leads or lags FB_CLK signal 24.

Control circuit CTRL 18 is electrically connected to COMP circuit 16 and to forward delay circuit 12. CTRL circuit 18 issues CTRL signal 28 to forward delay circuit 12, and receives COMP signal 30 from COMP circuit 16. Dependent at least in part upon COMP signal 30, CTRL circuit 18 adjusts CTRL signal 28 to thereby increase, decrease or leave unchanged the amount of time by which forward delay circuit 12 delays CLK_OUT signal 26 relative to REF_CLK signal 22, i.e., CTRL signal 28 adjusts the length of the forward delay line of forward delay circuit 12. Control circuit CTRL 18 is configured, for example, as a shift register which causes stored data to move to the right or left one bit position based on the phase difference between REF_CLK signal 22 and FB_CLK signal 24, as will be appreciated by those skilled in the art.

In use, REF_CLK signal 22 is provided to DLL circuit 10 by, for example, an external clock network (not shown). Upon startup, DLL circuit 10 is reset such that forward delay circuit 12 introduces substantially no delay. REF_CLK signal 22 is thus essentially passed undelayed through forward delay circuit 12. CLK_OUT signal 26, i.e., the undelayed version of REF_CLK signal 22 emerging from forward delay circuit 12, is provided to feedback delay circuit 14 which issues FB_CLK signal 24. FB_CLK signal 24 is delayed relative to REF_CLK signal 22 by $t_{FB}$. FB_CLK signal 24 is compared to REF_CLK signal 22 by compare circuit COMP 16. COMP circuit 16 determines the phase relationship of the signals and issues COMP signal 30, which is indicative of that phase relationship, to control circuit CTRL 18.

Control circuit CTRL 18, in turn, issues CTRL signal 28 to adjust, if necessary, the length of the forward delay line of forward delay circuit 12. Assuming the REF_CLK 22 and FB_CLK 24 signals are exactly in phase, CTRL signal 28 sets forward delay circuit 12 to add no additional delay to the CLK_OUT signal 26 relative to REF_CLK signal 22. Thus, CLK_OUT 26 of DLL 10 is initially aligned with the propagation delay of IC 20. As the operating conditions of IC 20 change, and the propagation delay $t_P$ thereof increases or decreases, $t_{FB}$ changes accordingly. The above-described comparison of REF_CLK signal 22 with FB_CLK signal 24 is repeated, with any change in $t_P$ being tracked by a corresponding change in $t_{FB}$. The change in $t_{FB}$ correspondingly alters the delay of FB_CLK signal 24, and thus the length of time by which forward delay circuit 12 delays CLK_OUT 26 relative to REF_CLK signal 22 tracks the change in $t_P$.

Figure 2:
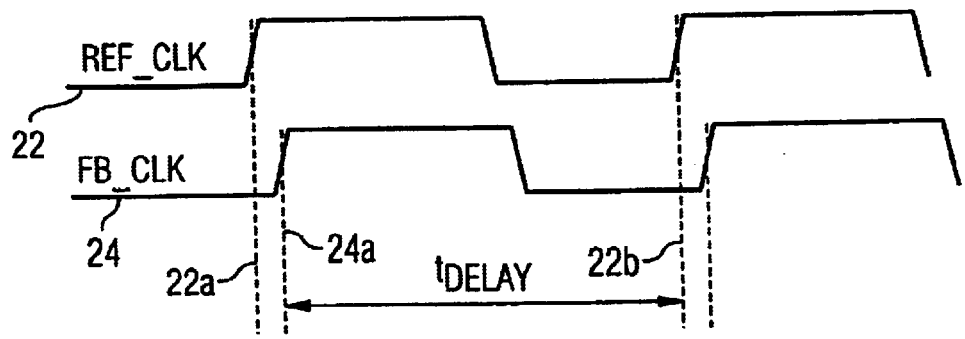
FIG. 2 is a timing diagram showing the worst-case relationship between a reference clock signal and a feedback clock signal applied to a conventional DLL.

In order to have the capability to align the clocks in all cases, the delay line of forward delay circuit 12 must be able to increase the delay of CLK_OUT signal 26 up to the length of the cycle time of the lowest operational frequency of REF_CLK signal 22 and/or IC 20. Referring now to FIG. 2, a worst case scenario for the time alignment of FB_CLK signal 24 and REF_CLK signal 22 is shown. With REF_CLK signal 22 at a logical high state when the rising edge 24a of FB_CLK signal 24 occurs, the forward delay necessary to align FB_CLK signal 24 with REF_CLK signal 22, as indicated by $t_{DELAY}$, can approach the entire period of REF_CLK signal 22.

More particularly, this worst case scenario exists when the rising edge 22a of REF_CLK signal 22 slightly precedes or leads the rising edge 24a of FB_CLK signal 24. In order to align the clocks in this situation, FB_CLK 24 signal must be delayed such that rising edge 24a thereof coincides with the next rising edge 22b of REF_CLK signal 22. Thus, since FB_CLK signal 24 is a delayed version of CLK_OUT signal 26, CLK_OUT signal 26 must be delayed by a period of time $t_{DELAY}$ approaching, if not substantially equal to, the period of REF_CLK signal 22. Introducing such a relatively lengthy delay into CLK_OUT signal 26 requires forward delay circuit 12 to include a multitude of power-consuming delay elements and thus increases the amount of time required for DLL 10 to "lock", i.e., time align the clock signals.

Figure 3:
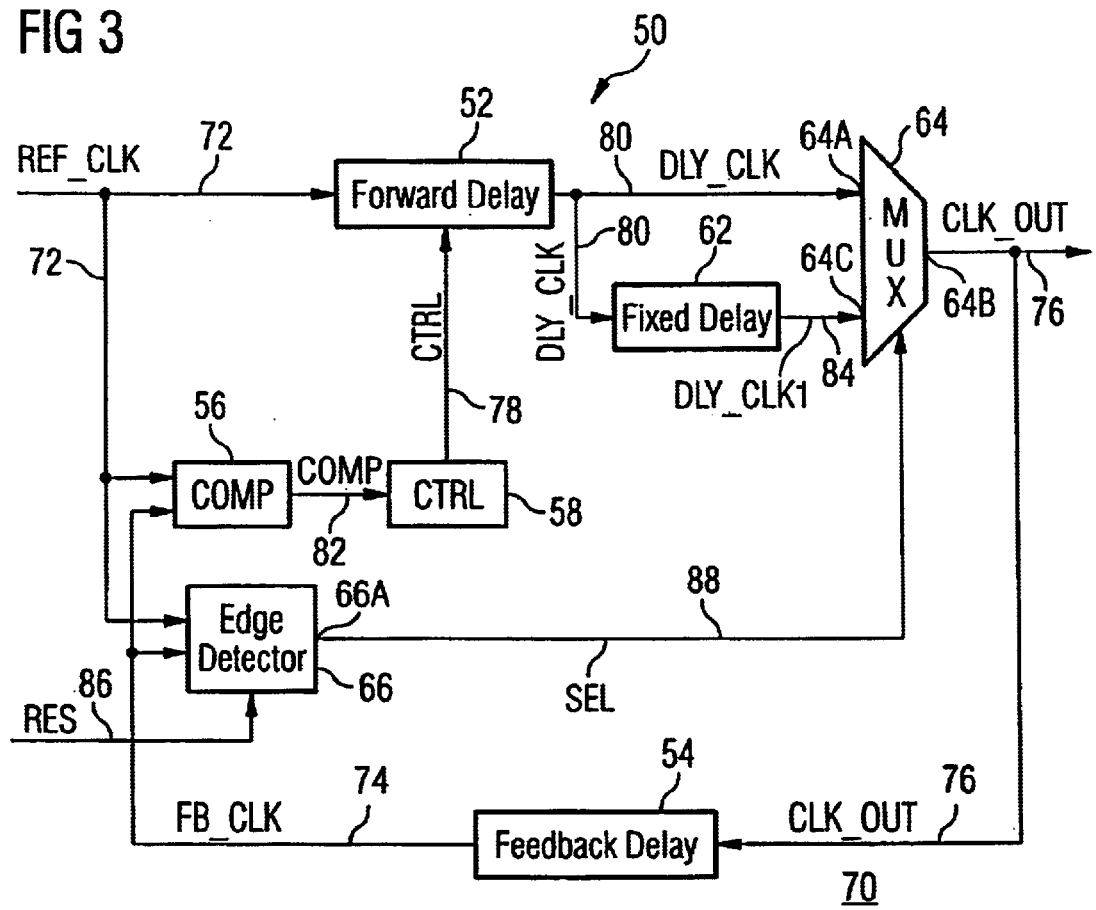
FIG. 3 is a block diagram of one embodiment of a DLL of the present invention.

Referring now to FIG. 3, a block diagram of one embodiment of the DLL of the present invention is shown. DLL 50 includes forward delay circuit 52, feedback delay circuit 54, comparator circuit COMP 56, and control circuit CTRL 58. DLL 50 further includes fixed delay circuit 62, clock multiplexer 64, and edge detector circuit 66. DLL circuit 50 is formed, for example, on a common substrate with, or is commonly packaged with and interconnected to, integrated circuit (IC) 70, such as, for example, a dynamic random access memory (DRAM) chip.

Generally, DLL circuit 50 receives reference clock signal REF_CLK 72, detects transitions, such as, for example, the rising edges, of REF_CLK signal 72 and FB_CLK signal 74 during reset of DLL 50, and selectively delays by a fixed delay time CLK_OUT signal 76. By selectively delaying CLK_OUT signal 76 by a fixed delay time dependent at least in part upon the relative transitions of REF_CLK signal 72 and FB_CLK signal 74, the length of the delay line and the amount of time required to achieve a lock or time alignment are substantially reduced. Furthermore, the resolution of forward delay circuit 52 is increased without incurring a corresponding increase in the amount of time required to achieve a lock condition.

Forward delay circuit 52 receives REF_CLK signal 72, and is electrically interconnected with each of control circuit CTRL 58, fixed delay circuit 62, and clock multiplexer (MUX) 64. Forward delay circuit 52 issues intermediate delayed clock signal DLY_CLK signal 80, which is essentially a delayed version of REF_CLK signal 72. More particularly, forward delay circuit 52 is electrically connected to CTRL circuit 58, and receives therefrom CTRL signal 78. Forward delay circuit 52 issues DLY_CLK signal 80 to each of fixed delay circuit 62 and input 64A of MUX 64. The amount of time by which forward delay circuit 52 delays DLY_CLK signal 80 relative to REF_CLK signal 72 is dependent at least in part upon CTRL signal 78. Forward delay circuit 52 includes a forward delay line having a plurality of delay elements (not shown), such as, for example, buffers or invertors, electrically connected in series. Each of the delay elements has a delay time of one unit delay, or $t_U$. A unit delay can be any period of time appropriate to the application of DLL 50, such as, for example, tens, hundreds or thousands of picoseconds, or longer.

Feedback delay circuit 54 is electrically connected to output 64B of MUX 64 and receives therefrom CLK_OUT signal 76. Feedback delay circuit 54 is further electrically connected to compare circuit COMP 56 and to edge detecting circuit 66. Feedback delay circuit issues FB_CLK signal 74 to each of compare circuit COMP 56 and edge detecting circuit 66. FB_CLK signal 74 is essentially a delayed version of CLK_OUT signal 76. FB_CLK signal 74 is delayed relative to CLK_OUT signal 76 by a feedback delay time, $t_{FB}$. Feedback delay time $t_{FB}$ is substantially equal to the propagation delay $t_P$ of REF_CLK signal 72 through IC 70, and tracks changes in the propagation delay through IC 70 due to the aforementioned external factors. Thus, as the operating conditions and parameters of IC 70 change, feedback delay time $t_{FB}$ tracks any change in $t_P$. Feedback delay circuit 54 includes one or more delay elements (not shown) that delay FB_CLK signal 74 relative to CLK_OUT signal 76 by feedback time $t_{FB}$.

Compare circuit COMP 56 receives REF_CLK signal 72 and FB_CLK signal 74. COMP 56 compares REF_CLK signal 72 to FB_CLK signal 74, and issues COMP signal 82 to control circuit CTRL 58. Compare circuit COMP 56 is conventional in construction and design, such as, for example, a phase detector, and is known to those skilled in the art.

Control circuit CTRL 58 is electrically connected to COMP 56 and to forward delay circuit 52. CTRL circuit 58 receives COMP signal 82 from COMP 56, and issues CTRL signal 78 to forward delay circuit 52. Dependent at least in part upon COMP signal 82, CTRL circuit 58 adjusts CTRL signal 78 to thereby increase, decrease or leave unchanged the amount of time by which forward delay circuit 54 delays intermediate DLY_CLK signal 80 relative to REF_CLK signal 72. Control circuit CTRL 58 is configured, for example, as a shift register which causes stored data to move to the right or left one bit position based on the difference between REF_CLK signal 72 and FB_CLK signal 74 as indicated by COMP signal 82, as will be appreciated by those skilled in the art.

Fixed delay circuit 62 is electrically connected to forward delay circuit 54 and to input 64C of MUX 64. Fixed delay circuit 62 receives DLY_CLK signal 80 from forward delay circuit 54 and issues DLY_CLK1 signal 84 to input 64C of MUX 64. DLY_CLK1 signal 84 is delayed relative to DLY_CLK signal 80 by a predetermined and fixed amount of time, such as, for example, from approximately twenty-five percent to approximately seventy-five percent of the lowest operational/clock frequency of IC 70. Fixed delay circuit 62 includes one or more delay units, such as, for example, inverters or buffers, to thereby provide the predetermined fixed delay time.

Multiplexer MUX 64 has inputs 64A and 64C electrically connected to the output of forward delay circuit 52 and to the output of fixed delay circuit 62, respectively, and therefore receives each of DLY_CLK signal 80 and DLY_CLK1 signal 84. MUX 64 is also electrically connected to edge detecting circuit 66, and receives therefrom select signal SEL 88. MUX 64, dependent at least in part upon SEL signal 88, selects one of DLY_CLK signal 80 and DLY_CLK1 signal 84. The selected one of DLY_CLK signal 80 and DLY_CLK1 signal 84 is issued on output 64B as CLK_OUT signal 76. Thus, MUX 64 selects which one of DLY_CLK signal 80 and DLY_CLK1 signal 84 is connected to feedback delay circuit 54. MUX 64 is conventional in construction and design.

Edge detecting circuit 66 includes output 66A. Edge detecting circuit 66 receives REF_CLK signal 72 and FB_CLK signal 74. Edge detecting circuit 66 also receives reset signal RES 86. RES signal 86 becomes active during a reset of IC 70. IC 70 is reset, such as, for example, during power up. Edge detecting circuit 66 is enabled dependent at least in part upon RES signal 86, and thus the time during which RES signal 86 is active is hereinafter referred to as the edge detection window. When RES signal 86 is not active or becomes inactive, output 66A of edge detecting circuit 66 is latched to the value or logic level it acquired during the edge detection window. Output 66A is electrically connected to MUX 64, and issues thereto SEL signal 88. SEL signal 88 becomes active, such as, for example, a logic high, when edge detecting circuit 66 detects a transition, such as, for example, a rising edge, on each of FB_CLK signal 74 and REF_CLK signal 72 during the edge detecting window. Edge detecting circuit 66 is of conventional design and construction.

In use, DLL 50 generally operates to select one of DLY_CLK signal 80 and DLY_CLK1 signal 84 to issue as CLK_OUT signal 76 dependent at least in part upon the relative transitions of REF_CLK signal 72 and FB_CLK signal 74 during the reset of IC 70. Output 64B of MUX 64 is electrically connected to the input of feedback delay circuit 54. Thus, the selected one of DLY_CLK signal 80 and DLY_CLK1 signal 84 which is output as CLK_OUT signal 76 is input to feedback delay circuit 54. As stated above, DLY_CLK1 signal 84 is delayed relative to DLY_CLK signal 80 by a predetermined and fixed amount of time, such as, for example, from approximately twenty-five percent to approximately seventy-five percent of the lowest operational/clock frequency of IC 70. By selecting for a given set of relative transitions occurring on REF_CLK signal 72 and FB_CLK signal 74 the appropriate one of DLY_CLK signal 80 and DLY_CLK1 signal 84 to issue as CLK_OUT signal 76, and thus as the input to feedback delay circuit 54, the length of the forward delay line of forward delay circuit 52 is substantially reduced. Furthermore, the amount of time required to achieve a lock condition is substantially reduced without incurring a corresponding reduction in the resolution of DLL 50.

The operation of DLL 50 is now more particularly described and is contrasted with the operation of a conventional DLL circuit, such as DLL 10, under the same worst-case operating scenario as described above and shown in FIG. 2. The worst case scenario, as shown in FIG. 2, exists when the rising edge 22a of REF_CLK signal 22 slightly precedes or leads the rising edge 24a of FB_CLK signal 24. In order to align the clock edges in this worst-case scenario, conventional DLL 10 must delay FB_CLK signal 24 such that rising edge 24a thereof coincides with the next rising edge 22b of REF_CLK signal 22. Thus, conventional DLL 10 must delay CLK_OUT signal 26, upon which FB_CLK signal 24 is based, by a period of time $t_{DELAY}$ that approaches the period of REF_CLK signal 22. Introducing such a relatively lengthy delay into CLK_OUT signal 26 requires forward delay circuit 12 to include a multitude of delay elements and therefore substantially increases the amount of time required for DLL 10 to lock or time-align the clock signals.

Figure 4:
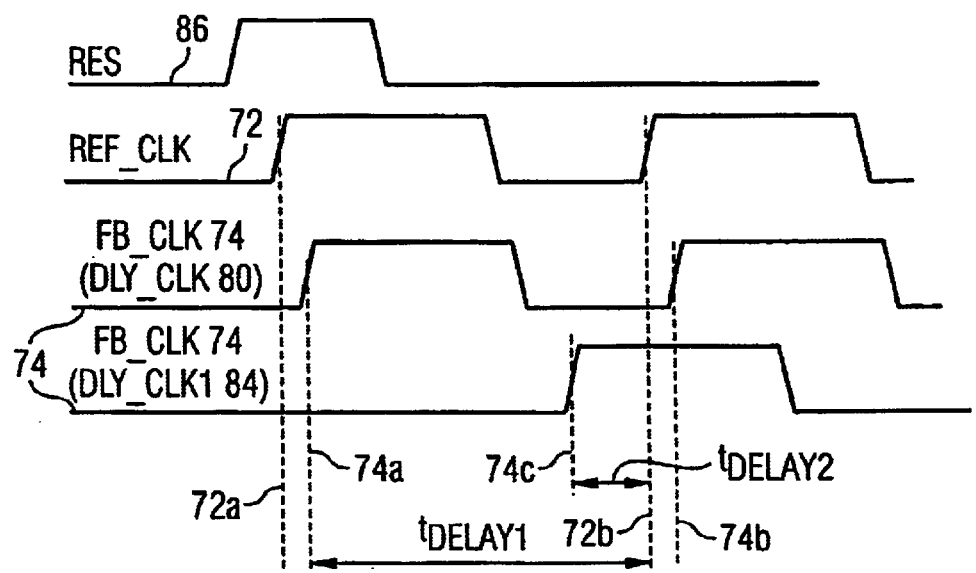
FIG. 4 is a timing diagram showing the operation of the DLL of the present invention under the worst-case relationship between the reference clock signal and the feedback signal.

In contrast, the operation of DLL 50 under the same worst-case operating conditions is described hereinafter and shown in FIG. 4. RES signal 86 is activated, such as, for example, during power up of IC 70, for a predetermined amount of time, i.e., the edge detection window. RES signal 86 is received by and enables edge detecting circuit 66. Edge detecting circuit 66 also receives each of REF_CLK signal 72 and FB_CLK signal 74. Edge detecting circuit 66, dependent at least in part upon the relative transitions of REF_CLK signal 72 and FB_CLK signal 74 during the edge detection window, issues SEL signal 88. SEL signal 88 is received by MUX 64 which, dependent at least in part upon SEL signal 88, selects one of DLY_CLK signal 80 and DLY_CLK1 signal 84 to issue on output 64B as CLK_OUT signal 76. Feedback delay circuit 54 is electrically connected to output 64B of MUX 64 and thus receives CLK_OUT signal 76. In short, DLL 50 selects, dependent upon the relative transitions of REF_CLK signal 72 and FB_CLK signal 74 during the edge detection window, one of DLY_CLK signal 80 and DLY_CLK1 signal 84 to issue as CLK_OUT signal 76 and be input to feedback delay circuit 54.

If DLL 50 were to select DLY_CLK signal 80 to issue as CLK_OUT signal 76 under these worst case operating conditions substantially the same situation as that obtained in conventional DLL 10 and as depicted in FIG. 2 would result. More particularly, under the worst-case operating conditions rising edge 72a of REF_CLK signal 72 slightly leads rising edge 74a of FB_CLK signal 74 (DLY_CLK signal 80). In order to align the two signals if DLY_CLK signal 80 were selected as the input to feedback delay circuit 52, rising edge 74a of FB_CLK signal 74 (DLY_CLK signal 80) would have to be delayed by an amount of time $t_{DELAY1}$. Delaying FB_CLK signal 74 (DLY_CLK signal 80) by $t_{DELAY1}$ would align rising edge 74a thereof with rising edge 72b of REF_CLK signal 72. However, the time $t_{DELAY1}$ would approach the period of REF_CLK signal 72 under these worst-case operating conditions. Thus, if DLY_CLK signal 80 were selected as the input to feedback delay circuit 54 under these operating conditions, forward delay circuit 52 would require the same relatively long forward delay line required by conventional DLL 10.

In contrast, DLL 50 substantially reduces the length of the required forward delay line by selecting between DLY_CLK signal 80 and DLY_CLK signal 84 as the input to feedback delay circuit 54. Under the worst case operating conditions of FIG. 4, DLL 50 selects DLY_CLK1 signal 84 rather than DLY_CLK signal 80 as the input to feedback delay circuit 54. Since DLY_CLK1 signal 84 is essentially a delayed version of DLY_CLK signal 80, the time difference between rising edge 72b of REF_CLK signal 72 and the rising edge 74c of FB_CLK signal 74 (DLY_CLK1 signal 84) is substantially reduced. More particularly, with DLY_CLK1 signal 84 as the input to feedback delay circuit 52, rising edge 74c of FB_CLK signal 74 (DLY_CLK1 signal 84) must be delayed by an amount of time $t_{DELAY2}$ in order to align rising edge 74c thereof with rising edge 72b of REF_CLK signal 72. The time period $t_{DELAY2}$ is substantially less than the time period $t_{DELAY1}$. Thus, by selecting DLY_CLK1 signal 84 as the input to feedback delay circuit 54, DLL 50 has reduced the amount of time by which FB_CLK signal 74 must be adjustably delayed.

Since CLK_OUT signal 76 is the input to feedback delay circuit 54, FB_CLK signal 74 is adjustably delayed by delaying CLK_OUT signal 76. Forward delay circuit 52 adjusts the delay of CLK_OUT signal 76 and, therefore, of FB_CLK signal 74. Since DLL 50 substantially reduces the amount of time by which FB_CLK signal 74 must be delayed, the required length of the forward delay line of forward delay circuit 52 is also substantially reduced. Accordingly, forward delay circuit 52 of DLL 50 requires a shorter forward delay line length in order to lock the clock signals under the worst case operating conditions, and can therefore include delay units of relatively high resolution without sacrificing speed of operation relative to a conventional DLL circuit.

In the embodiment shown, the delay lock loop circuit of the present invention is described as being for use with relatively large ICs, such as, for example, memory chips and programmable logic arrays. However, it is to be understood that the delay lock loop circuit of the present invention can be used in any other IC that requires or could benefit from clock skew adjustment.

In the embodiment shown, the edge detecting circuit is enabled during reset of IC 70 and during that window checks for rising edges on the reference clock and feedback clock signals. However, it is to be understood that the present invention can be alternately configured, such as, for example, checking for falling edges or other transitions on the reference and feedback clock signals.

While this invention has been described as having a preferred design, the present invention can be further modified within the spirit and scope of this disclosure. This application is therefore intended to cover any variations, uses, or adaptations of the present invention using the general principles disclosed herein. Further, this application is intended to cover such departures from the present disclosure as come within the known or customary practice in the art to which this invention pertains and which fall within the limits of the appended claims.

What is claimed:

1. A delay lock loop circuit receiving a reference clock signal, said delay lock loop (DLL) circuit for aligning in time an output clock signal thereof with an internal feedback clock signal, said DLL circuit comprising:
   a forward delay circuit receiving said reference clock signal, said forward delay circuit issuing a first delayed clock signal, said forward delay circuit adjustably shifting in time said first delayed clock signal relative to said reference clock signal;
   a fixed delay circuit receiving said first delayed clock signal, said fixed delay circuit issuing a second delayed clock signal, said second delayed clock signal being shifted in time relative to said first delayed clock signal;
   a selecting means selecting one of said first delayed and said second delayed clock signals to issue as said output clock signal; and
   a feedback delay circuit receiving said output clock signal and issuing said feedback clock signal, said feedback clock signal being shifted in time relative to said output clock signal.

2. A delay lock loop circuit receiving a reference clock signal, said delay lock loop (DLL) circuit for aligning in time an output clock signal thereof with an internal feedback clock signal, said DLL circuit comprising:
   a forward delay circuit receiving said reference clock signal, said forward delay circuit issuing a first delayed clock signal, said forward delay circuit adjustably shifting in time said first delayed clock signal relative to said reference clock signal;
   a fixed delay circuit receiving said first delayed clock signal, said fixed delay circuit issuing a second delayed clock signal, said second delayed clock signal being shifted in time relative to said first delayed clock signal;
   a feedback delay circuit receiving said output clock signal and issuing said feedback clock signal, said feedback clock signal being shifted in time relative to said output clock signal; and
   selecting means selecting one of said first delayed and said second delayed clock signals to issue as said output clock signal, said selecting means including comparing means comparing said feedback clock signal to said reference clock signal, said comparing means issuing a select signal, said select signal being indicative of a time shift of said feedback clock signal relative to said reference clock signal; and a multiplexer receiving each of said first delayed and said second delayed clock signals and said select signal, said multiplexer connecting one of said first delayed and said second delayed clock signals to said feedback delay circuit dependent at least in part upon said select signal, said selected one of said first delayed and said second delayed clock signals issuing as said output clock signal.

3. The delay lock loop circuit of claim 2, wherein said comparing means comprises an edge detector circuit, said edge detector circuit receiving said feedback clock signal and said reference clock signal, said edge detector circuit configured for being enabled by a reset signal, said edge detector issuing said select signal.

4. The delay lock loop circuit of claim 3, wherein said select signal causes said multiplexer to connect said second delayed clock signal to said feedback delay circuit and to issue as said output clock signal when a respective transition occurs on each of said reference clock signal and said feedback clock signal while said edge detector is enabled.

5. The delay lock loop circuit of claim 3, wherein said select signal causes said multiplexer circuit to connect said first delayed clock signal to said feedback delay circuit and to issue as said output clock signal when a respective transition does not occur on each of said reference clock signal and said feedback clock signal while said edge detector is enabled.

6. An integrated circuit having a substrate, said integrated circuit comprising:
   a delay lock loop (DLL) circuit being at least one of integrally formed on said substrate and electrically interconnected with said integrated circuit, said DLL circuit receiving a reference clock signal and aligning in time an output clock signal with an internal feedback clock signal, said DLL circuit including:
      a forward delay circuit receiving said reference clock signal, said forward delay circuit issuing a first delayed clock signal, said forward delay circuit adjustably shifting in time said first delayed clock signal relative to said reference clock signal;
      a fixed delay circuit receiving said first delayed clock signal, said fixed delay circuit issuing a second delayed clock signal, said second delayed clock signal being shifted in time relative to said first delayed clock signal;

a selecting means selecting one of said first delayed and said second delayed clock signals to issue as said output clock signal; and a feedback delay circuit receiving said output clock signal, and issuing said feedback clock signal, said feedback clock signal being shifted in time relative to said output clock signal.

7. An integrated circuit having a substrate, said integrated circuit comprising:

a delay lock loop (DLL) circuit being at least one of integrally formed on said substrate and electrically interconnected with said integrated circuit, said DLL circuit receiving a reference clock signal and aligning in time an output clock signal with an internal feedback clock signal, said DLL circuit including:

a forward delay circuit receiving said reference clock signal, said forward delay circuit issuing a first delayed clock signal, said forward delay circuit adjustably shifting in time said first delayed clock signal relative to said reference clock signal;

a fixed delay circuit receiving said first delayed clock signal, said fixed delay circuit issuing a second delayed clock signal, said second delayed clock signal being shifted in time relative to said first delayed clock signal;

a selecting means including a comparing means comparing said feedback clock signal to said reference clock signal, said comparing means issuing a select signal, said select signal being indicative of a time shift of said feedback clock signal relative to said reference clock signal, and a multiplexer receiving each of said first delayed, said second delayed, and said select signals, said multiplexer connecting one of said first delayed and said second delayed clock signals to said feedback delay circuit dependent at least in part upon said select signal, said selected one of said first delayed and said second delayed clock signals issuing as said output clock signal; and a feedback delay circuit receiving said output clock signal, and issuing said feedback clock signal, said feedback clock signal being shifted in time relative to said output clock signal.

8. The delay lock loop circuit of claim 7, wherein said comparing means comprises an edge detector circuit, said edge detector circuit receiving said feedback clock signal and said reference clock signal, said edge detector circuit configured for being enabled by a reset signal, said edge detector issuing said select signal.

9. The delay lock loop circuit of claim 8, wherein said select signal causes said multiplexer to connect said second delayed clock signal to said feedback delay circuit and to issue as said output clock signal when a respective transition occurs on each of said reference clock signal and said feedback clock signal while said edge detector is enabled.

10. The delay lock loop circuit of claim 8, wherein said select signal causes said multiplexer circuit to connect said first delayed clock signal to said feedback delay circuit and to issue as said output clock signal when a respective transition does not occur on each of said reference clock signal and said feedback clock signal while said edge detector is enabled.

11. A method for aligning in time an output clock signal with a feedback clock signal, said feedback clock signal being delayed in time relative to a reference clock signal to thereby simulate a propagation delay of an integrated circuit, said method comprising:

receiving the reference clock signal;

issuing a first delayed clock signal that is delayed by a forward delay time relative to the reference clock signal;

issuing a second delayed clock signal that is delayed by a second delay time relative to said first delayed clock signal;

selecting one of said first delayed clock signal and said second delayed clock signal to issue as the output clock signal;

delaying by said feedback delay time the output clock signal to thereby create a feedback clock signal;

comparing said feedback clock signal to said reference clock signal;

adjusting the forward delay time of said output clock signal dependent at least in part upon said comparing step; and repeating said comparing and adjusting steps to thereby time align said output clock signal with said feedback clock signal.

12. The method of claim 11, wherein said selecting step comprises:

receiving a reset signal;

monitoring during an active state of said reset signal each of said reference clock signal and said feedback clock signal for a transition;

issuing said second delayed clock signal as the output clock signal when a respective transition is detected on each of said reference clock signal and said feedback clock signal during said monitoring step; and otherwise issuing said first delayed clock signal as the output clock signal.

* * * * *